(12) United States Patent
Hara et al.

(10) Patent No.: US 8,194,364 B2
(45) Date of Patent: Jun. 5, 2012

(54) MAGNETORESISTIVE EFFECT ELEMENT IN CPP-TYPE STRUCTURE INCLUDING FERROMAGNETIC LAYER CONFIGURED WITH COFE SYSTEM ALLOY AND MAGNETIC DISK DEVICE THEREWITH

(75) Inventors: Shinji Hara, Tokyo (JP); Tsutomu Chou, Tokyo (JP); Yoshihiro Tsuchiya, Tokyo (JP); Hironobu Matsuzawa, Tokyo (JP)

(73) Assignee: TDK Corporation, Tokyo (JP)

( * ) Notice: Subject to any disclaimer, the term of this patent is extended or adjusted under 35 U.S.C. 154(b) by 290 days.

(21) Appl. No.: 12/461,972

(22) Filed: Aug. 31, 2009

(65) Prior Publication Data

US 2011/0051295 A1    Mar. 3, 2011

(51) Int. Cl.
*G11B 5/33* (2006.01)
(52) U.S. Cl. .................................. 360/324.12
(58) Field of Classification Search .............. 360/324.12
See application file for complete search history.

(56) References Cited

U.S. PATENT DOCUMENTS

| 7,855,859 | B2 * | 12/2010 | Hara et al. ................ 360/324.1 |
| 2006/0002039 | A1 * | 1/2006 | Hasegawa et al. ....... 360/324.11 |
| 2007/0019341 | A1 * | 1/2007 | Mizuno et al. ........... 360/324.11 |
| 2007/0195592 | A1 | 8/2007 | Yuasa |
| 2007/0253122 | A1 | 11/2007 | Fukuzawa et al. |

FOREIGN PATENT DOCUMENTS

| JP | A-2002-068889 | 3/2002 |
| JP | A-2002-298323 | 10/2002 |

OTHER PUBLICATIONS

Nishikawa et al., Binary Alloy Phase Diagrams $2^{nd}$ Edition, pp. 1186-1187 (Jun. 1984).

* cited by examiner

*Primary Examiner* — David D Davis
(74) *Attorney, Agent, or Firm* — Posz Law Group, PLC

(57) ABSTRACT

In an MR element of the present invention, an effect of an extremely-high MR ratio is obtained since a crystal structure of a CoFe magnetic layer in the vicinity of an interface with a spacer layer is formed as a close packed structure, such as an hcp structure and an fcc structure, and a total existing ratio of these crystal structures is 25% or more by an area ratio.

8 Claims, 12 Drawing Sheets

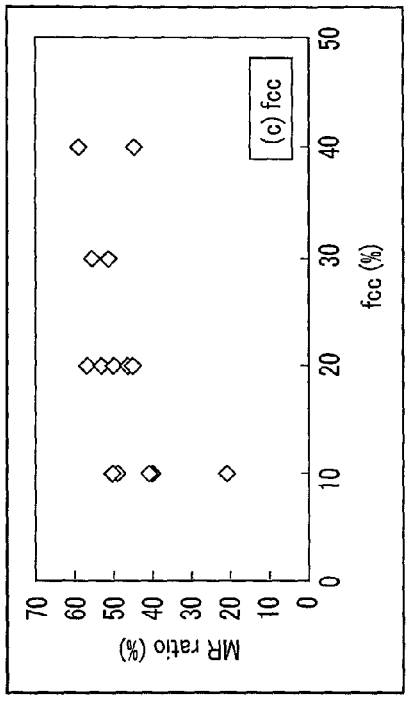
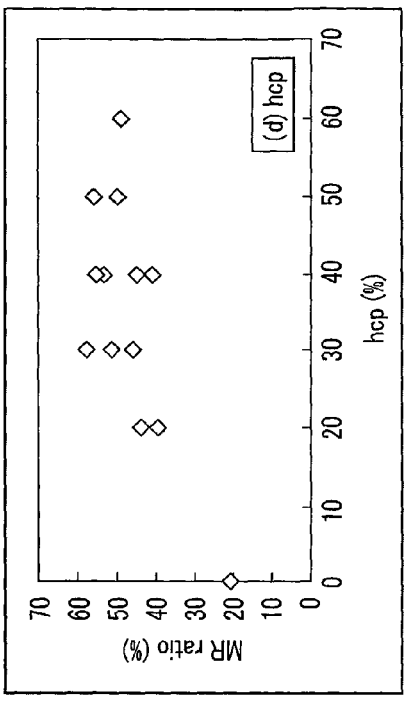
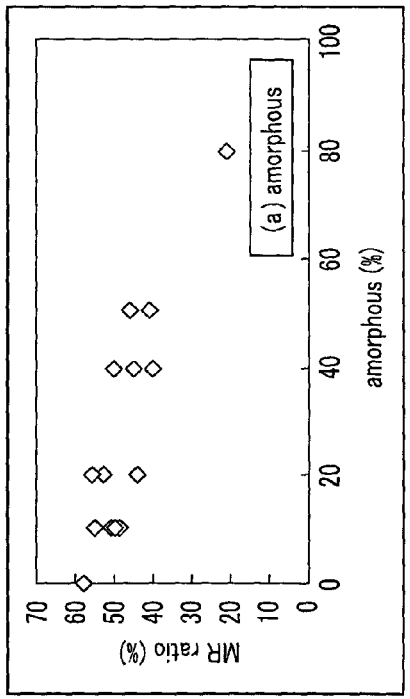
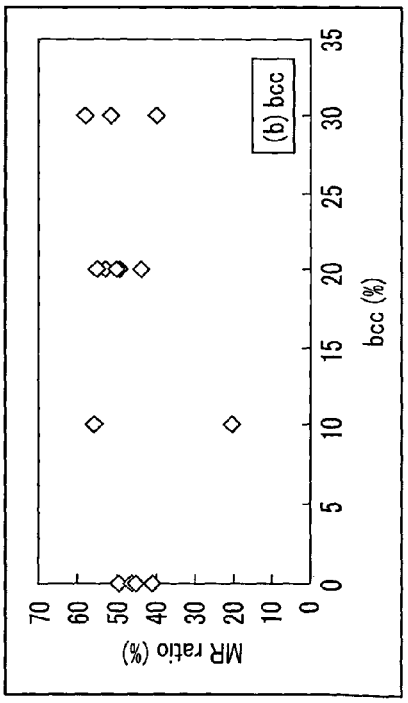

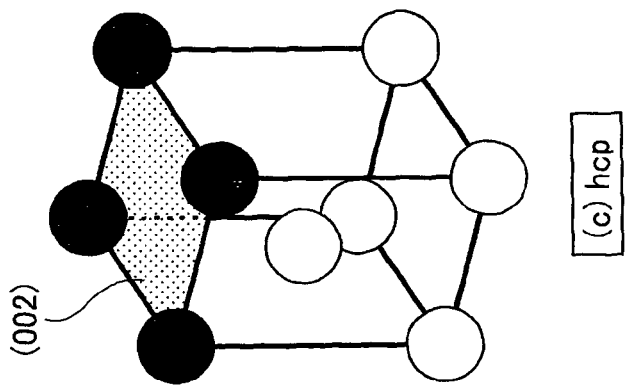
FIG.13C (c) hcp
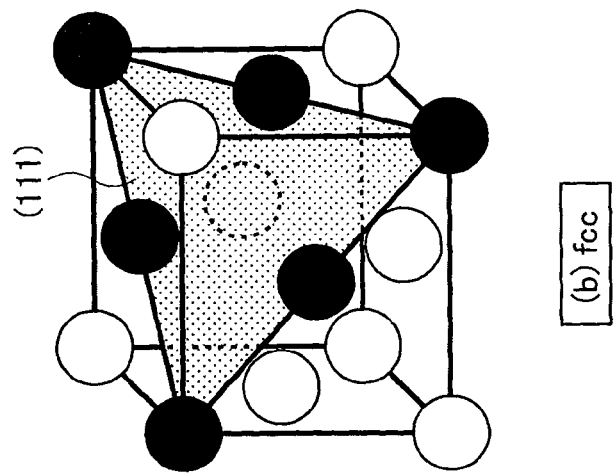
FIG.13B (b) fcc
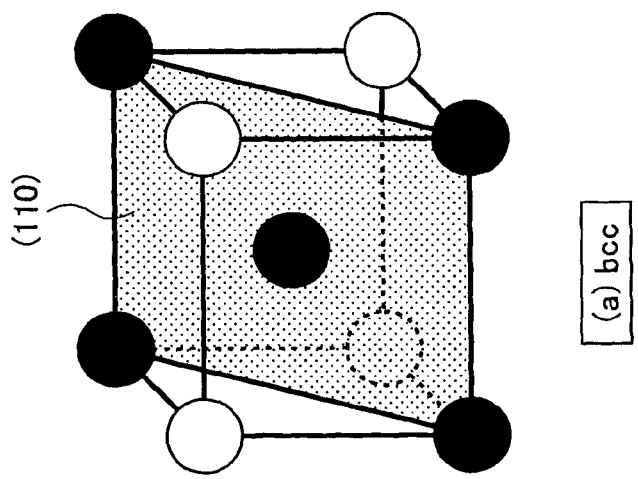
FIG.13A (a) bcc

MAGNETORESISTIVE EFFECT ELEMENT IN CPP-TYPE STRUCTURE INCLUDING FERROMAGNETIC LAYER CONFIGURED WITH COFE SYSTEM ALLOY AND MAGNETIC DISK DEVICE THEREWITH

BACKGROUND OF THE INVENTION

1. Field of the Invention

The present invention relates to a magnetoresistive effect element (MR element) in a current perpendicular to plane (CPP) type structure that detects magnetic field intensity as a signal from a magnetic recording medium, and so on, a thin film magnetic head with the MR element, and a head gimbal assembly and a magnetic disk device that have the thin film magnetic head.

2. Description of Related Art

In recent years, with an increase in the high recording density of a magnetic disk drive (HDD), there have been growing demands for improvements in the performance of a thin film magnetic head. For a thin film magnetic head, a composite type thin film magnetic head has been widely used; it has a structure where a reproducing head having a read-only magnetoresistive effect element (hereinafter, magneto-resistive (MR) element), and a recording head having a write-only induction type magnetic conversion element are laminated together.

Generally, a shield layer is formed in a reproducing head to restrict an area of a medium that interferes with a reproducing element. Currently, in a conventional head structure, a first shield film, a second shield film and an MR element are connected in series without an intershield insulating layer. This structure is referred to as an MR element in a CPP-type structure. In consideration of the efficiency of heat dissipation and maintenance of an output, and so on, a CPP-type structure is essential to realize a high recording density beyond 500 Gbits/in$^2$.

A general CPP-type element with a spin valve is briefly explained below. A typical spin valve CPP-type element is formed by a lamination structure for its main layers as follows: a lower electrode layer/an under layer/an antiferromagnetic layer/a ferromagnetic layer (1)/a spacer layer/a ferromagnetic layer (2)/a cap layer/an upper electrode layer. The top most layer is the upper electrode layer, and the bottom most layer is the lower electrode layer. In the specification hereinafter, a lamination structure may be described as having the above format.

A magnetization direction of the ferromagnetic layer (1), which is one of the ferromagnetic layers, is pinned in the perpendicular direction to a magnetization direction of the ferromagnetic layer (2) when an externally applied magnetic field is zero. The ferromagnetic layer (2) is generally referred to as a magnetic free layer. The magnetization direction of the ferromagnetic layer (1) can be pinned by making an antiferromagnetic layer adjacent thereto and providing unidirectional anisotropic energy (also referred to as "exchange bias" or "coupling magnetic field") to the ferromagnetic layer (1) by means of exchange-coupling between the antiferromagnetic layer and the ferromagnetic layer (1). For this reason, the ferromagnetic layer (1) is also referred to as a magnetic pinned layer.

As mentioned above, the CPP-type element that is configured with a connection between a shield layer and an MR element through a metal is advantageous because it increases heat dissipation efficiency and operating current. In this CPP element, a smaller cross sectional area of an element has a larger resistance value and a larger resistance variation. Namely, it is an appropriate structure for a so called narrower track width. A narrower track width increases the number of tracks per inch (TPI), and it is an essential technology for increasing the recording density of a hard disk drive (HDD).

Examples of the reading element in the CPP-type structure are as follows: a tunneling magnetoresistance (TMR) element with an insulating material as a spacer layer, such as MgO or Al$_2$O$_3$; a CPP-GMR element with a conductive material of a semiconductor, such as Cu, Au, or Ag; and a current confined path (CCP) CPP-GMR element in which a current path configured with a nonmagnetic metal in an insulating layer.

With respect to a signal to noise (S/N) ratio that is an important parameter in the reading element mentioned above, an MR ratio contributes to the signal portion of the S/N ratio, and element resistance contributes to the noise portion of the S/N ratio, respectively. In short, a low resistance element having a higher MR ratio is strongly sought. This demand is applicable to any type of reading elements discussed above. A proposition of a configuration for a novel element having a higher MR ratio in the same element resistance is sought.

CoFe is generally used for two magnetic layers that sandwich a spacer layer, which is a part of a primary structure generating a magnetoresistive effect (MR effect). When a content ratio of Fe in CoFe is higher, an MR ratio of an element has the tendency to be higher. The content ratio of Fe in CoFe is usually approximate 70% by atomic weight.

According to a phase diagram of Co—Fe shown in FIG. 14 (BINARY ALLOY PHASE DIAGRAMS 2$^{ND}$ edition, T. B. Massalski), when Fe was added with approximately 23% by atomic weight or higher, the CoFe is generally formed in an αFe phase at a temperature from an ordinary temperature to 500° C., which was a typical temperature range of manufacturing and operating for a thin film magnetic head. Note that, even though FIG. 14 does not show data below 500° C., when the CoFe is in an αFe phase at a temperature of 500° C., a state of the CoFe is supported as an αFe phase at a temperature range below 500° C. A crystal structure of this αFe phase was configured with a body centered cubic (bcc) structure and was generally oriented in a (110) plane at a temperature of a laminating process.

SUMMARY OF THE INVENTION

In order to develop an element structure that enables further improvement of an MR ratio, inventors of the present invention have been focused on crystal structures of a spacer layer as a part of a primary structure generating an MR effect and of a CoFe magnetic layer provided in the vicinity of interfaces between the spacer layer and two CoFe system magnetic layers formed to sandwich the spacer layer. The inventors of the present invention found that when crystal structures of the CoFe magnetic layer in a laminating interface were formed with a phase of a close packed structure, such as a hexagonal closed package (hcp) structure and a face centered cubic (fcc) structure, and an existing ratio of these crystal structures was over a certain amount, the MR ratio was significantly increased. As a result, they conceived the present invention.

Namely, an MR element according to the present invention is a giant magnetoresistive effect element in a current perpendicular to plane (CPP-GMR) structure. The MR element includes a spacer layer, a first ferromagnetic layer and a second ferromagnetic layer that are laminated to sandwich the spacer layer, in which a sense current flows along a lamination direction of the first and second ferromagnetic layers. The first ferromagnetic layer is formed before the second ferromagnetic layer is formed, and is located below the second ferromagnetic layer. Angle of magnetization directions of the first ferromagnetic layer and the second ferromagnetic layer relatively change due to an externally applied magnetic field. The spacer layer is configured with a nonmagnetic material of a hexagonal system. At least one of the first ferromagnetic layer and the second ferromagnetic layer is configured with a CoFe system magnetic alloy (CoFe and an alloy of CoFe as a main component) containing a component of Fe with at least 25% by atomic weight. The CoFe system magnetic alloy has a face centered cubic (fcc) structure and/or a hexagonal closed package (hcp) structure as a crystal structure at an interface with the spacer layer. A total existing ratio of the fcc structure and the hcp structure in the CoFe system magnetic alloy at the interface with the spacer layer is 25% or more by an area ratio.

As a preferred embodiment of the present invention, both the first ferromagnetic layer and the second ferromagnetic layer are configured with the CoFe system magnetic alloy, which is made of CoFe or has CoFe as the main component, containing the component of Fe with at least 25% by atomic weight, and the CoFe system magnetic alloys have the fcc structure and/or the hcp structure as the crystal structure at the interface with the spacer layer, and the total existing ratio of the fcc structure and the hcp structure in the CoFe system magnetic alloy of the first ferromagnetic layer at the interface with the spacer layer is 25% or more by the area ratio, and the total existing ratio of the fcc structure and the hcp structure in the CoFe system magnetic alloy of the second ferromagnetic layer at the interface with the spacer layer is 25% or more by the area ratio.

As a preferred embodiment of the present invention, a crystal orientation of the fcc structure in the CoFe system magnetic alloy is a (111) plane, and a crystal orientation of the hcp structure in the CoFe system magnetic alloy is a (002) plane.

As a preferred embodiment of the present invention, the first ferromagnetic layer and the second ferromagnetic layer have a characteristic to be crystallized by a heat treatment.

As a preferred embodiment of the present invention, the spacer layer is made of one nitride selected from the following: GaN, AlN, InN, TaN, and NbN.

A thin film magnetic head of the present invention includes an air bearing surface (ABS) that is opposite to a recording medium, the magnetoresistive effect element (MR element) described above that is provided in the vicinity of the ABS to detect a signal magnetic field from the recording medium, and a pair of electrodes that apply an electric current in a lamination direction of the MR element.

A head gimbal assembly of the present invention includes a slider having the thin film magnetic head described above and being provided opposite to a recording medium, and a suspension elastically supporting the slider.

A magnetic disk device of the present invention includes a slider having the thin film magnetic head described above and being provided opposite to a recording medium, and a positioning device supporting the slider and locating a position of the slider with respect to the recording medium.

In the present invention, an effect of an increase of an MR ratio is obtained since crystal structures of a CoFe magnetic layer in a laminating interface with the spacer layer are formed in a phase of a close packed structure, such as an hcp structure and an fcc structure, and an existing ratio of these crystal structures is more than a certain amount.

A phenomenon of the increased MR ratio has not been completely comprehended. However, it could be understood as a factor for increasing an MR ratio that an hcp structure and an fcc structure have a higher packed ratio of atoms and that these structures have a superior symmetric property compared with a bcc structure that is an ordinary crystal structure.

BRIEF DESCRIPTION OF THE DRAWINGS

FIG. 2 is a sectional view of a thin film magnetic head that is perpendicular to an ABS and a substrate according to one embodiment of the present invention.

FIG. 11A is a graph for showing a correlation between a percentage (%) of an amorphous state and an MR ratio. FIG. 11B is a graph for showing a correlation between a percentage (%) of a bcc structure and an MR ratio. FIG. 11C is a graph for showing a correlation between a percentage (%) of an fcc structure and an MR ratio. FIG. 11D is a graph for showing a correlation between a percentage (%) of an hcp structure and an MR ratio.

FIG. 13A is a graph for showing a bcc structure that is available for CoFe and a general orientation plane of its lamination. FIG. 13B is a graph for showing an fcc structure that is available for CoFe and a general orientation plane of its lamination. FIG. 13C is a graph for showing an hcp structure that is available for CoFe and a general orientation plane of its lamination.

DETAILED DESCRIPTION OF THE PREFERRED EMBODIMENTS

The best mode for implementing the present invention will be described in detail hereafter.

Figure 1:
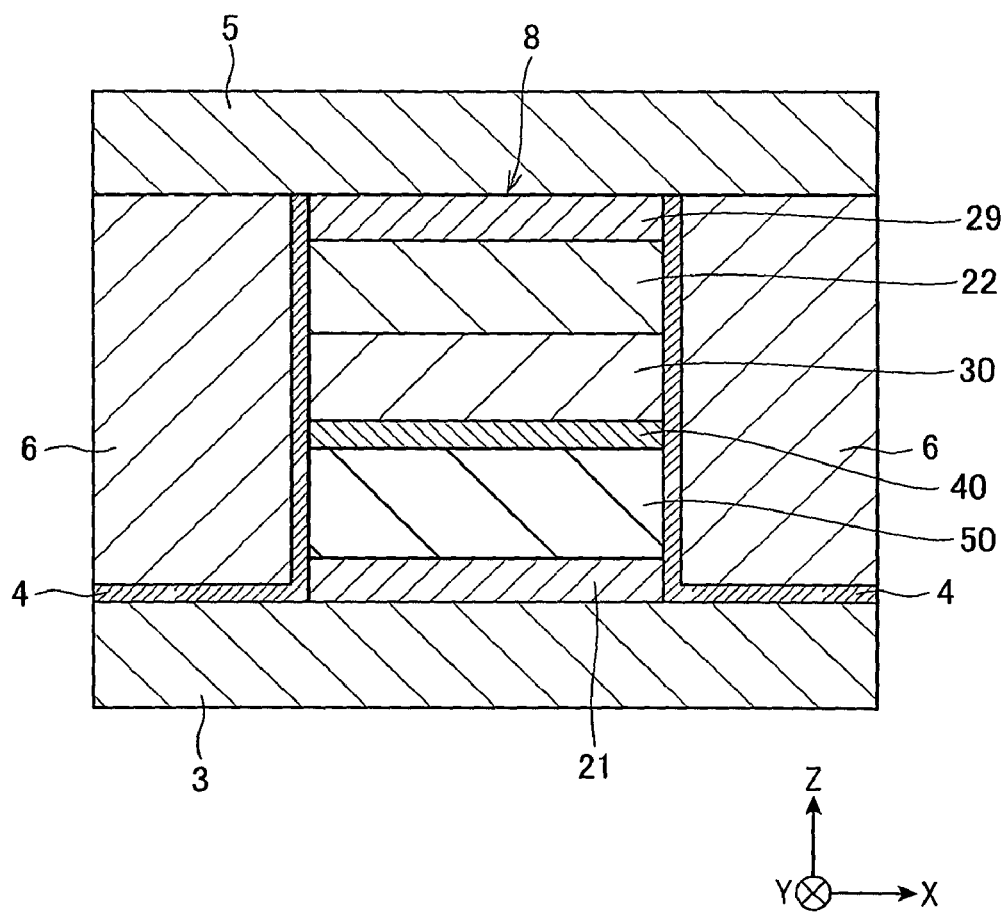
FIG. 1 is a sectional view of a reproducing head that is parallel to an opposing medium surface (or air bearing surface, hereinafter collectively ABS) of a recording medium according to one embodiment of the present invention.

FIG. 1 is a schematic view of an air bearing surface (ABS) of a reproducing head according to one embodiment of the present invention. Specifically, it shows the ABS of a giant magnetoresistive effect element in a CPP-type structure (CPP-GMR element), which is a main part of the present invention. The ABS generally corresponds to a surface at which a reproducing head is in opposition to a recording medium (hereinafter often called the opposing medium surface or ABS); however, it is understood that the ABS of the present invention includes not only the surface but also a section where a lamination structure of the element can be clearly observed. For instance, a passivation layer of diamond-like carbon (DLC) or the like (the passivation layer adapted to cover the element), in a strict sense, positioned at the ABS may be omitted if necessary.

Figure 2:
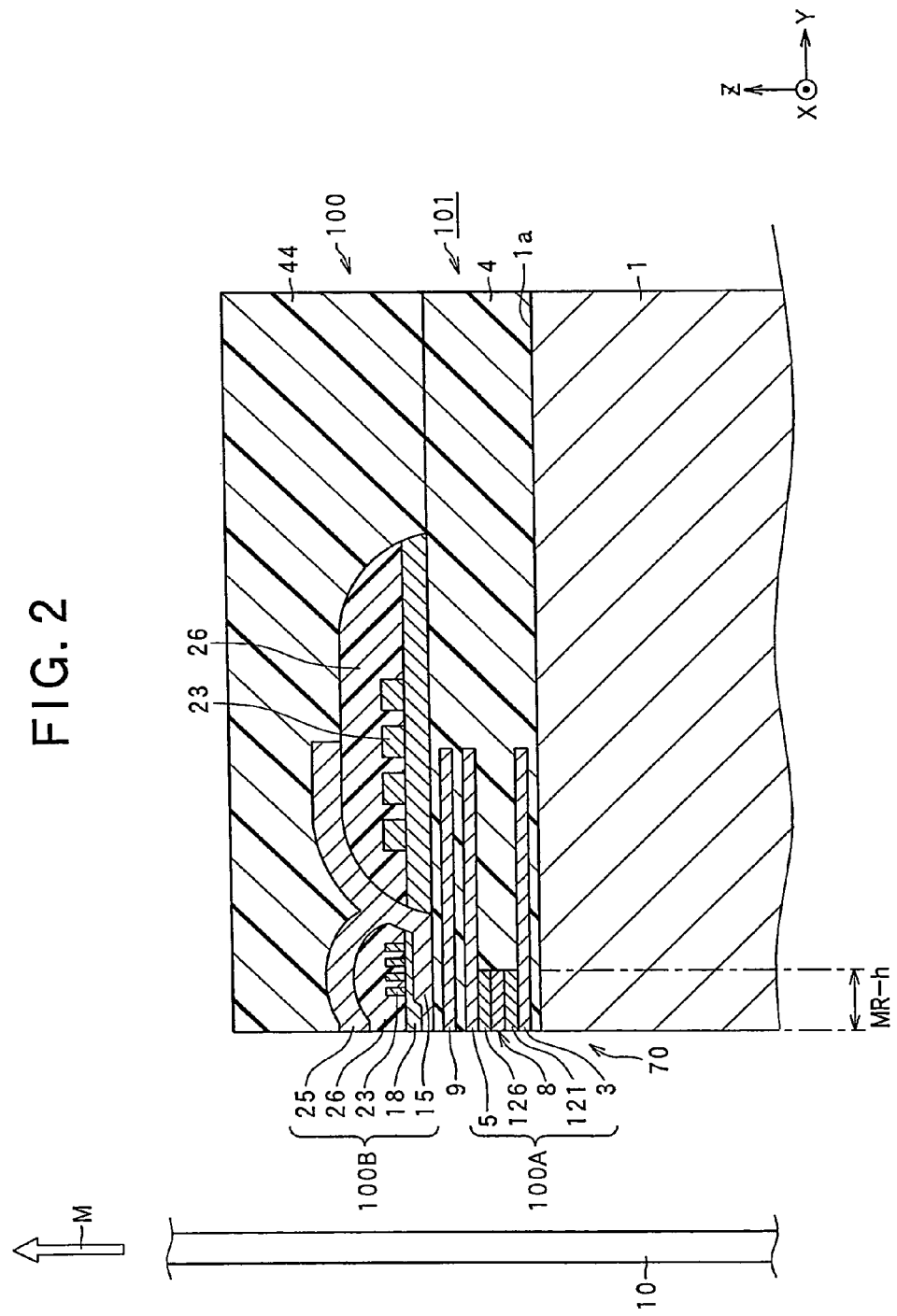
FIG. 2 is a view for explaining the structure of the thin film magnetic device. Particularly.

FIG. 2 is a sectional view of a thin film magnetic head that is perpendicular to an ABS and a substrate according to one embodiment of the present invention, for explaining the structure of the thin film magnetic head.

Figure 3:
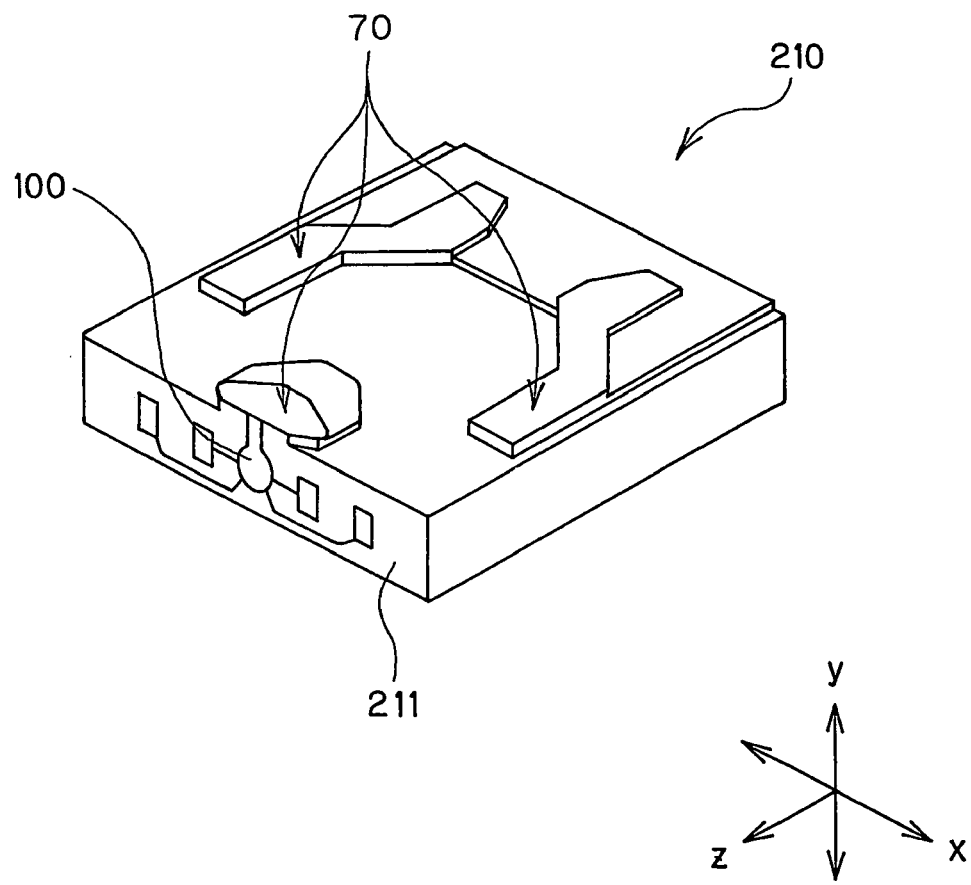
FIG. 3 is a perspective view of a slider that is a part of a head gimbal assembly according to one embodiment of the present invention.
Figure 4:
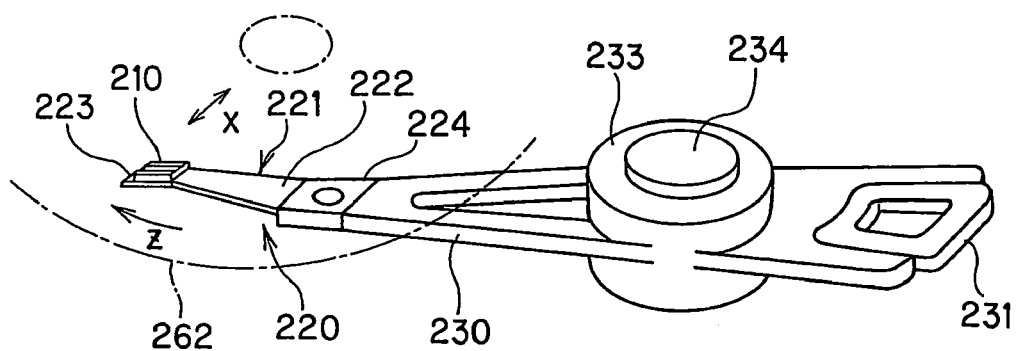
FIG. 4 is a perspective view of a head arm assembly that contains a head gimbal assembly according to one embodiment of the present invention.
Figure 5:
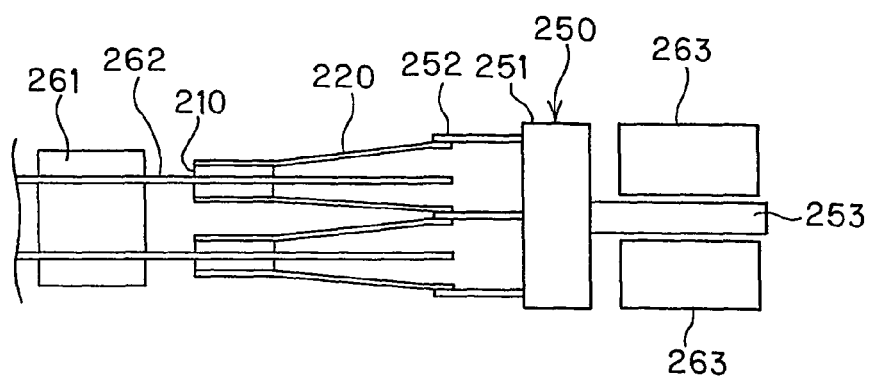
FIG. 5 is an illustration for explaining primary parts of a magnetic disk device according to one embodiment of the present invention.
Figure 6:
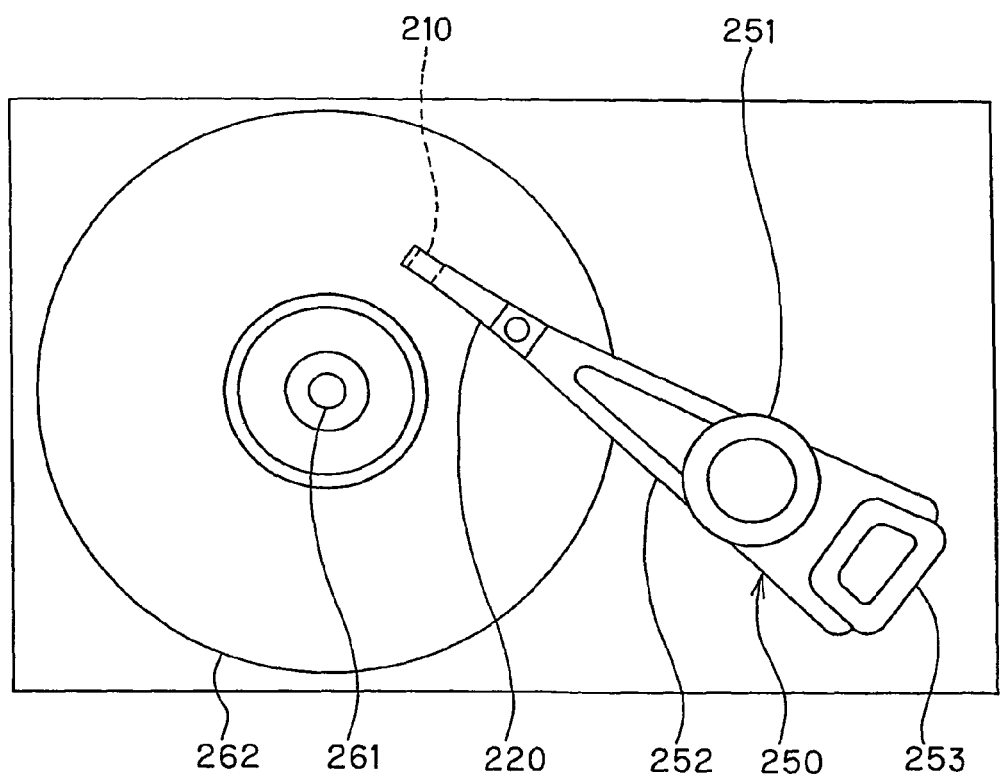
FIG. 6 is a top plan view of a magnetic disk device according to one embodiment of the present invention.

FIG. 3 is a perspective view of a slider that is a part of a head gimbal assembly according to one embodiment of the present invention. FIG. 4 is a perspective view of a head arm assembly that contains a head gimbal assembly according to one embodiment of the present invention. FIG. 5 is an illustration for explaining primary parts of a magnetic disk device according to one embodiment of the present invention. FIG. 6 is a top plan view of a magnetic disk device according to one embodiment of the present invention.

In the explanation below, the X axis is defined as "width," the Y axis is defined as "length," and the Z axis is defined as "thickness" in each drawing. In the Y axis direction, an area that is close to an ABS (hereinafter, referred as an opposing medium surface) is defined as "front," and an area that is opposite side of the front is defined as "rear (or posterior)." The laminated up direction of an element is defined as "above" or "upper side," and the opposite direction is defined as "below" or "lower side."

[GMR Element in CPP-Type Structure (CPP-GMR Element)]

A detailed description of a structure of a reproducing head of a giant magnetoresistive effect element in a CPP-type structure (CPP-GMR element) according to the present invention is given below with reference to FIG. 1.

As described above, FIG. 1 is a sectional view corresponding to a section of a reproducing head parallel to an ABS.

As shown in FIG. 1, the reproducing head according to the present embodiment includes a first shield layer 3 and a second shield layer 5 that are spaced apart and opposed to each other in a thickness direction, a giant magnetoresistive effect element 8 (hereinafter referred simply to as "GMR element") interposed between the first shield layer 3 and the second shield layer 5, an insulating film 4 adapted to cover two sides of the GMR element 8 and a part of the upper surface of the first shield layer 3 along those sides, and two bias magnetic field application layers 6 adjacent to the two sides of the GMR element 8 through the insulating film 4.

In this embodiment, the first shield layer 3 and the second shield layer 5 function both as a magnetic shield and as a pair of electrodes. In other words, they not only shield magnetism but also enable a sense current to flow in a direction intersecting the plane of each of the layers forming the GMR element 8 such as, for instance, in a direction perpendicular to the plane of each of the layers forming the GMR element 8 (lamination direction). For this reason, the first shield layer 3 and the second shield layer 5 may be referred to as a "lower electrode layer 3" and an "upper electrode layer 5," respectively.

In addition to the first shield layer 3 and the second shield layer 5, another pair of electrodes may be provided above and below the GMR element 8.

A reproducing head according to the present invention includes the GMR element 8 as a main part in a CPP-type structure.

The GMR element 8 in a CPP-type structure according to the present invention as shown in FIG. 1 has a spacer layer 40, and a first ferromagnetic layer 50 and a second ferromagnetic pinned layer 30, which are laminated to sandwich the spacer layer 40.

The first ferromagnetic layer 50 is formed before the second ferromagnetic layer 30 is formed and is a layer provided in a lower part of the structure in the present invention. Angle of magnetization directions of the first ferromagnetic layer 50 and the second ferromagnetic layer 30 relatively change due to an externally applied magnetic field.

With respect to the first ferromagnetic layer 50 and the second ferromagnetic layer 30, they may have the following structure: (1) when either one of the ferromagnetic layers 50, 30 is magnetically pinned, the angle of the magnetization directions relatively change due to an externally applied magnetic field, or (2) when the both ferromagnetic layers 50, 30 are free layers, both angle of magnetization directions relatively change due to an externally applied magnetic field.

In a preferred embodiment shown in FIG. 1, the second ferromagnetic layer 30 located in an upper part of the structure is magnetically pinned and acts as a magnetic pinned layer 30; and the first ferromagnetic layer 50 located in a lower part of the structure acts as a free layer 50. As a sense current flows in a lamination direction of the GMR element 8, it causes the GMR element 8 to become operative in the current perpendicular to plane (CPP) type structure.

As discussed above, a magnetization direction of the free layer 50 changes due to an externally applied magnetic field, i.e., a signal magnetic field from a recording medium; and a magnetization direction of the magnetic pinned layer 30 is pinned due to an influence from an antiferromagnetic layer 22. In FIG. 1, the magnetic pinned layer 30 is formed in an upper part of the structure relative to the free layer 50. Therefore, the antiferromagnetic layer 22 is formed in an upper part relative to the magnetic pinned layer 30. This structure in the embodiment is referred to as a top-type structure. A positional relationship between the magnetic pinned layer 30 and the free layer 50 may be interchanged so that the magnetic pinned layer 30 is formed in a lower part relative to the free layer 50. Therefore, the antiferromagnetic layer 22 is formed in a lower part relative to the magnetic pinned layer 30. Of course, this structure referred to as a bottom-type structure can be used as an embodiment.

A cap layer 29 is formed on the antiferromagnetic layer 22 in FIG. 1.

An under layer 21 is formed below the free layer 50.

A detailed explanation of each structure is given below.

[Explanation of Spacer Layer 40]

The spacer layer 40 according to the present invention is configured with a nonmagnetic material of a hexagonal system.

Specifically, the nonmagnetic material is made of one material selected from the following group: GaN, ZnO, ZnS, AlN, InN, TaN, SiC, MnS, AgI, MnSe, MnTe, MnSb, MnBi, FeS, FeSe, FeTe, FeSb, CoS, CoSe, CoTe, CoSb, NiS, NiSb, NiSe, NiTe, NiSn, NiAs, NbAs, NbN, CrSe, CrTe, CrSb, PtSb, and PtBi.

More preferably, the nonmagnetic material is made of a nitride, such as GaN, AlN, InN, TaN, or NbN. Preferably, the nonmagnetic material is made of GaN. The spacer layer 40, which is configured with a nonmagnetic material of a hexagonal system, not only provides an effect of generating a magnetoresistive effect, but also enables influence of crystal structures in the vicinity of interfaces of the first ferromagnetic layer 50 and the second ferromagnetic layer 30 that contact the spacer layer 40. Please see an experiment discussed later.

A layer thickness of the spacer layer 40 is 1.0 through 5.0 nm.

[Explanation of Free Layer 50 as First Ferromagnetic Layer and Magnetic Pinned Layer 30 as Second Ferromagnetic Layer]

The free layer 50 as the first ferromagnetic layer is a layer of which a magnetization direction varies depending on an externally applied magnetic field, i.e., a signal magnetic field from a recording medium, and is configured with a ferromagnetic layer with a low coercive force (soft magnetic layer).

The magnetic pinned layer 30 as the second ferromagnetic layer is magnetically pinned by an influence of the antiferromagnetic layer 22 that is formed on the magnetic pinned layer 30.

A part adjacent the spacer layer 40 of at least one of the first ferromagnetic layer and the second ferromagnetic layer is configured under the condition of the following requirements 1 through 3. Preferably, both the first ferromagnetic layer and the second ferromagnetic layer are configured under the condition of the following requirements 1 through 3.

[Requirement 1]

The part is configured with a CoFe system magnetic alloy containing a component of Fe with at least 25% (preferably 40 to 90% by atomic weight, and more preferably 60 to 80% by atomic weight).

Here, the "CoFe system magnetic alloy" means that an alloy of CoFe or an alloy containing CoFe as a main component. Examples of an alloy containing CoFe as a main component are as follows: CoFeB, CoFeAl, CoFeNi, CoFeSi, CoFeC, CoFeV, CoFeCr, CoFeMn, CoFeCu, CoFeAg, and CoFeZn.

"CoFe as a main component" means that an alloy contains CoFe with at least 80% by atomic weight.

The reason why an alloy contains a component of Fe with at least 25% by atomic weight is that when there is a higher content ratio of Fe, there is a tendency for a higher MR ratio.

[Requirement 2]

The CoFe system magnetic alloy, as a crystal structure in an interface with the spacer layer 40, contains crystals with an fcc structure and/or an hcp structure. The sum of a percentage (a total existing ratio) of the fcc structure and a percentage of the hcp structure is 25% or more by an area ratio at the interface (preferably 30% or more, and more preferably 50% or more).

When this value is below 25%, there is a problem that a highly improved MR ratio is not obtained as discussed later. An upper limit of this value can be 100%. Generally, this value is in a range of approximately 30 to 100%.

A crystal structure of the CoFe system magnetic alloy in an interface with the spacer layer 40 is determined as an amorphous (noncrystalline) state, a bcc structure, an fcc structure, or an hcp structure through observation of a TEM picture of a vertical cross section of a structure with a three-atom layer. Each existing ratio of these structures is expressed by an area ratio for each structure. Note that the three-atom layer is required for determining a crystal structure.

A phenomenon of a high increase of an MR ratio according to the present invention has not been correctly comprehended. However, it could be understood as a factor for increasing an MR ratio that the hcp structure and the fcc structure have a higher packed ratio of atoms and have a superior symmetric property compared with the bcc structure as an ordinary crystal structure. Several structures that are available for CoFe and a general orientation plane of its lamination are shown in FIGS. 13A through 13C, and the present invention is considered below.

In an ordinary fabricating process as discussed above, it is known that CoFe has a bcc structure and is oriented in a (110) plane (FIG. 13A). However, in the present invention, a certain amount of crystals with the fcc structure and/or the hcp structure exists in the interface with the spacer layer 40 as a CoFe crystal structure. The fcc structure (FIG. 13B) and the hcp structure (FIG. 13C) have a higher packed ratio of atoms (referred to as a "close packed structure") and have a superior symmetric property compared with the bcc structure (FIG. 13A) that is ordinarily formed. It could be understood that the existence of such a structure is a factor for improving the MR ratio.

Note that a general orientation plane of the laminated fcc structure is a close packed (111) plane as shown in FIG. 13B, and a general orientation plane of the laminated hcp structure is a close packed (002) plane as shown in FIG. 13C.

[Requirement 3]

A magnetic layer, which has a characteristic of undergoing crystallization by a heat treatment (crystallization from an amorphous state), is required.

CoFe has the bcc structure in an ordinary fabricating process. In the present invention, a CoFe layer is initially formed in a pseudo-amorphous state during the fabricating process of the CoFe layer. Then, the CoFe layer is crystallized by a heat treatment (for example, at a temperature of 200 to 400° C. for 1 to 10 hours). At the time of this crystallization, in the CoFe interface, a crystallization of the fcc structure and a crystallization of the hcp structure are accelerated through the influence from the hexagonal system crystal structure of the adjacently located spacer layer 40.

The CoFe layer is configured in which the sum of a percentage of the fcc structure and a percentage of the hcp structure is 25% or more by an area ratio at the interface.

The free layer 50 and the magnetic pinned layer 30 can be configured with a single layer structure, respectively. The free layer 50 and the magnetic pinned layer 30 may also be a multiple-layer structure, respectively, including several laminated ferromagnetic layers to the extent that they do not depart from the effect of the present invention. In the case of a multiple-layer structure, a composition for a lamination interface with the spacer layer 40 can be a CoFe system magnetic alloy.

The free layer 50 and the magnetic pinned layer 30 each have a thickness of, for example, approximately 2 to 10 nm.

[Explanation of Antiferromagnetic Layer 22]

As discussed above, since the antiferromagnetic layer 22 is exchange-coupled with the magnetic pinned layer 30, the antiferromagnetic layer 22 functions to pin a magnetization direction of the magnetic pinned layer 30.

The antiferromagnetic layer 22 is made of an antiferromagnetic material at least containing one element M' and Mn. Herein, the element M' is selected from a group, for example, consisting of Pt, Ru, Rh, Pd, Ni, Cu, Ir, Cr, and Fe. The Mn content is preferably 35 to 95% by atomic weight. The antiferromagnetic materials are categorized into two types:

(1) non-heat treatment type antiferromagnetic materials that exhibit antiferromagnetism without heat treatment and induce an exchange-coupled magnetic field between themselves and a ferromagnetic material; and (2) heat treatment type antiferromagnetic materials that exhibit antiferromagnetism with heat treatment. In the above type (1), heat treatment is usually performed to align an exchange-coupling direction. Either type (1) or (2) can be used in the present invention. Examples of non-heat treatment type antiferromagnetic materials include RuRhMn, FeMn, and IrMn. Examples of heat treatment type antiferromagnetic materials include PtMn, NiMn, and PtRhMn.

The antiferromagnetic layer 22 has a thickness of approximately 4 to 30 nm.

[Explanation of Under Layer 21]

The under layer 21, which is made of Ta, Ru, and so on, is formed below the free layer 50. The preferred under layer 21 is configured with a two-layer structure including Ta (lower layer) and Ru (upper layer).

The under layer 21 has a thickness of approximately 0.5 to 20 nm.

[Explanation of Cap Layer 29]

As shown in FIG. 1, the cap layer 29 that is made of, for example, a Ta layer or a Ru layer is formed on the antiferromagnetic layer 22. The cap layer 29 has a thickness of approximately 0.5 to 20 nm.

[Explanation of Variations of Element Configuration]

Variation 1

As discussed above, a positional relationship between the magnetic pinned layer 30 and the free layer 50 in FIG. 1 is interchanged so that the magnetic pinned layer 30 is formed in a lower part relative to the free layer 50. Therefore, the antiferromagnetic layer 22 is formed in a lower part relative to the magnetic pinned layer 30. This structure referred to as a bottom-type structure can also be used as an embodiment.

Variation 2

In the present invention, an MR element in which the condition of two magnetic layers functioning as a sensor relatively changes due to an externally applied magnetic field can be applied. In other words, the present invention is not limited to a type or a structure of an element explained above. A structure of the present invention can be applied to an MR element that has a simple three-layer lamination layer structure as a basic structure including two free layers, such as a first ferromagnetic layer/a spacer layer/a second ferromagnetic layer, disclosed in, for example, U.S. Pat. No. 7,019,371B2 and U.S. Pat. No. 7,035,062B1.

[Explanation of Overall Structure of Thin Film Magnetic Head]

FIG. 2 shows a sectional view (i.e., a cross section taken through the Y-Z plane) of a thin film magnetic head in parallel with the so-called air bearing surface (ABS).

A thin film magnetic head 100 as shown in FIG. 2 is mounted on a magnetic recording device such as a hard disk drive in order to magnetically process a recording medium 10 such as a hard disk that moves in a medium traveling direction M.

The thin film magnetic head 100 as exemplified in the drawing is a so-called complex type head that is executable for both recording processing and reproducing processing as magnetic processing. As shown in FIG. 2, it has a structure of a magnetic head part 101 formed on a slider substrate 1 structured of ceramic material such as ALTIC ($Al_2O_3 \cdot TiC$).

A magnetic head part 101 has a lamination constitution of a reproducing head part 100A for reproducing magnetic information recorded using the MR effect and, for example, a shield type recording head part 100B for executing the recording processing of the perpendicular recording system.

A description is given below in more detail.

A first shield layer 3 and a second shield layer 5 are flat layers formed in a manner of being substantially parallel to the side surface 1a of the slider substrate 1. The layers 3 and 5 form a part of the ABS 70.

An MR effect part 8 is sandwiched between the first shield layer 3 and the second shield layer 5 and forms part of the ABS 70. A height perpendicular to the ABS 70 (i.e., in the Y direction) is an MR height (MR-h).

The first shield layer 3 and the second shield layer 5 are formed by a pattern plating method including a frame plating method, for example.

The MR effect part 8 is a lamination layer substantially parallel to the side surface 1a of the slider substrate 1, and forms a part of the ABS 70.

The MR effect part 8 is a lamination layer in a film surface perpendicular type (or current perpendicular to plane: CPP) structure in which a sense current flows in the direction perpendicular to the laminating surface.

Moreover, as shown in FIG. 2, an interelement shield layer 9 made of the same material as that of the second shield layer 5 is formed between the second shield layer 5 and the recording head part 100B.

The interelement shield layer 9 shields the MR element 8 from a magnetic field generated by the recording head part 100B, thereby blocking exogenous noises at the time of reproduction. A bucking coil part may also be formed between the interelement shield layer 9 and the recording head part 100B. The bucking coil part generates magnetic flux that overrides a magnetic flux loop that is generated by the recording head part 100B and that passes through the upper and lower electrode layers of the MR element 8 and, therefore, suppresses unnecessary writing to a magnetic disk or wide area adjacent tracks erasing (WATE) phenomena that are erasing operations.

Insulating films 4 and 44 made of alumina and/or other materials are formed in following sections:

i) in a gap between the first shield layer 3 and the second shield layer 5 on the side opposite to the ABS 70 of the MR element 8;

ii) in rear (posterior) regions of the first and second shield layers 3 and 5 and the interelement shield layer 9, the rear regions being opposite to the ABS 70;

iii) in a gap between the first shield layer 3 and the slider substrate 1; and iv) in a gap between the interelement shield layer 9 and the recording head part 100B.

The recording head part 100B is preferably structured for perpendicular magnetic recording and, as shown in FIG. 2, has a main magnetic pole layer 15, a gap layer 18, a coil insulating layer 26, a coil layer 23, and an auxiliary magnetic pole layer 25. The perpendicular recording system can be exchanged with a so-called longitudinal recording system.

The main magnetic pole layer 15 is structured to be a leading magnetic path for leading and focusing magnetic flux initiated by the coil layer 23 to the recording layer of a magnetic recording medium 10. It is preferred that the end part of the main magnetic pole layer 15 on the side of the ABS 70 should be smaller in thickness compared with other portions in the track width direction (i.e., the direction along the X-axis in FIG. 2) and in the laminating direction (i.e., the direction along the Z-axis in FIG. 2). As a result, it is possible to generate a magnetic field for minute and strong writing corresponding to high recording density.

A trailing shield part that has a wider layer cross section than the other portions of the auxiliary magnetic layer 25 is formed on the end part of the auxiliary magnetic pole layer 25 magnetically coupled with the main magnetic pole layer 15 on the side of the ABS 70. As shown in FIG. 2, the auxiliary magnetic pole layer 25 is opposed to the end part of the main magnetic pole layer 15 on the side of the ABS 70 via the gap layer 18 made of insulating material such as alumina and the coil insulating layer 26.

The provision of the auxiliary magnetic pole layer 25 enables formation of a steep magnetic field gradient between the auxiliary magnetic pole layer 25 and the main magnetic pole layer 15 in the vicinity of the ABS 70. As a result, jitter is reduced in a signal output, thereby making the error ratio smaller at the time of reproducing.

The auxiliary magnetic pole layer 25 is formed, for example, to about 0.5-5 µm in thickness by a frame plating method, a sputtering method or the like. The material may be an alloy made of two or three elements selected from the group consisting of Ni, Fe and Co, for example, or an alloy made of these elements, as main components, along with predetermined chemical elements.

The gap layer 18 is formed in a manner of separating the coil layer 23 from the main magnetic pole layer 15. The gap layer 18 may be formed by a sputtering method, a CVD method or the like, for example, have a thickness of about 0.01-0.5 µm and be structured of $Al_2O_3$, diamond-like carbon (DLC) or the like.

[Explanation of Head Gimbal Assembly and Hard Disk Device]

Next, a head gimbal assembly on which the above mentioned thin film head is mounted and one embodiment of a hard disk device is described below.

First, a description of a slider 210 equipped with the head gimbal assembly is illustrated in FIG. 3. In the hard disk device, the slider 210 is opposed to a hard disk that is a rotatably driven disk-like recording medium. The slider 210 is provided with a base substrate 211 mainly configured of a substrate and an overcoat.

The base substrate 211 is substantially hexahedronal. Of the six surfaces of the base substrate 211, one surface is opposed to a hard disk. The ABS 70 is formed on the surface.

When a hard disk is rotated in the Z direction in FIG. 3, an airflow passing between the hard disk and the slider 210 creates lifting power downwardly in the Y direction in FIG. 3. The slider 210 floats from the surface of the hard disk by this lifting power. The X direction in FIG. 3 is the track traversing direction of the hard disk.

In the vicinity of the end part of the slider 210 on the air exit side (i.e., the end part on the lower left in FIG. 3), the thin film magnetic head according to the present embodiment is formed.

Next, a description of the head gimbal assembly 220 according to the present embodiment is described by referring to FIG. 4. The head gimbal assembly 220 is provided with the slider 210 and a suspension 221 for elastically supporting the slider 210. The suspension 221 has a plate spring load beam 222 formed of stainless steel, a flexure 223 that is provided on one end part of the load beam 222 and joined with the slider 210 in a manner of giving the slider 210 a proper degree of freedom, and a base plate 224 provided on the other end part of the load beam 222.

The base plate 224 is mounted on an arm 230 of an actuator for moving the slider 210 in the track traversing direction X of the hard disk 262. The actuator has the arm 230 and a voice coil motor for driving the arm 230. A gimbal part is provided for keeping a posture of the slider 210 constant on the portion of the flexure 223 on which the slider 210 is mounted.

The head gimbal assembly 220 is mounted on the arm 230 of the actuator. One arm 230 with a head gimbal assembly 220 mounted thereon is called a head arm assembly. A carriage having multiple arms, each of which has a head gimbal assembly mounted thereon, is referred as a head stack assembly.

FIG. 4 shows one embodiment of a head arm assembly. In this head arm assembly, a head gimbal assembly 220 is mounted on one end part of the arm 230. A coil 231, part of a voice coil motor, is mounted on the other end part of the arm 230. A bearing part 233 is provided in the middle part of the arm 230 so that a shaft 234 is rotatably supported.

A description of one example of the head stack assembly and the hard disk device according to the present embodiment is described by referring to FIGS. 5 and 6.

FIG. 5 is an illustration for explaining primary parts of a hard disk device. FIG. 6 is a plan view of the hard disk device.

The head stack assembly 250 has a carriage 251 having multiple arms 252. On the multiple arms 252 are mounted multiple head gimbal assemblies 220 in the perpendicular direction at certain intervals. A coil 253, part of a voice coil motor, is mounted on the opposite side of the arms 252 in the carriage 251. The head stack assembly 250 is incorporated into a hard disk device.

A hard disk device has multiple hard disks 262 mounted on a spindle motor 261. Two sliders 210 are disposed for each hard disk 262 in a manner of being opposed to each other by sandwiching the hard disk 262. The voice coil motor has permanent magnets 263 disposed in a manner of being opposed to each other by sandwiching the coil 253 of the head stack assembly 250.

The head stack assembly 250 and an actuator except for sliders 210 support as well as locate the slider 210 relative to the hard disk 22 corresponding to a positioning device of the present invention.

In the hard disk device according to the present embodiment, an actuator allows moving sliders 210 in the track traversing direction of the hard disk 262 in order to position sliders 210 relative to the hard disk 262. Thin film magnetic heads included in sliders 210 record information on the hard disk 262 by the recording head and reproduce (or read) information recorded in the hard disk 262 by the reproducing head.

The head gimbal assembly and hard disk device according to the present embodiment are as effective as the thin film magnetic head according to the above-mentioned embodiment.

In the embodiment, it is explained that a thin film magnetic head has a structure of a reproducing head part formed on the base substrate side and a perpendicular recording head part layered thereon. However, the layering order may be reversed. Moreover, the configuration may be such that only a reproducing part is provided in the case of a reproduction-only thin film head.

Exemplary Embodiment

The present invention related to a CPP-GMR element discussed above is explained through a detailed exemplary embodiment.

Experiment 1

1. First Ferromagnetic Layer (CoFe) (CoFe System Magnetic Alloy), Formed by Low Pressure Sputtering Method An MR effect layer configured with a lamination structure as shown in Table 1 was formed by a sputtering method.

As shown in Table 1, a basic structure of a lamination structure is that a Ta layer with a layer thickness of 2.0 nm and a Ru under layer with a layer thickness of 2.0 nm, which is configured as an under layer, were formed on a lower shield layer that had a layer thickness of 1,000 nm and that was made of NiFe. The following lamination layers were formed on the lamination layers discussed above in a bottom up direction: a first ferromagnetic layer that had a layer thickness of 4.0 nm and that was made of $Co_{30}Fe_{70}$; a spacer layer that had a layer thickness of 2.0 nm and that was made of GaN; a second ferromagnetic layer that had a layer thickness of 4.0 nm and that was made of $Co_{30}Fe_{70}$; an antiferromagnetic layer that had a layer thickness of 6.0 nm and that was made of IrMn; and a cap layer that had a layer thickness of 2.0 nm and that was made of Ru. After layers were formed, the lamination structure was processed by a heat treatment at 250° C. for three hours in a magnetic field of 1 tesla (T).

TABLE 1

| Lamination Structure | Layer Material | Layer Thickness (nm) |
|---|---|---|
| Cap Layer (29) | Ru | 2.0 |
| Antiferromagnetic Layer (22) | IrMn | 6.0 |
| Second Ferromagnetic Layer (30) | CoFe | 4.0 |
| Spacer Layer (40) | GaN | 2.0 |
| First Ferromagnetic Layer (50) | CoFe | 4.0 |
| Under Layer (21) | Ru | 2.0 |
|  | Ta | 2.0 |
| Lower Shield Layer (3) | NiFe | 1000 |

A lamination layer discussed above that forms a main structure of an element was fabricated in a quadrangular prism shape with dimensions of 100 nm×100 nm. Then, an insulating material ($Al_2O_3$) with a layer thickness of 20.0 nm covered sides of the fabricated quadrangular prism shape, and an upper electrode layer was formed at the top portion. As a result, samples of a CPP-MR element were made.

In fabrication processes of samples of the MR element, a number of crystals with an fcc structure and an hcp structure, which are crystal structures for the first ferromagnetic layer 50 (CoFe) in its interface with the spacer layer 40 that is made of GaN, can be increased by changing an atmospheric pressure of a layer forming the first ferromagnetic layer 50 (CoFe) or by adding an additive, for example, boron (B) or the like, to CoFe as a composition.

In Experiment 1, the first ferromagnetic layer (CoFe), which was a CoFe system magnetic alloy, was formed by a low pressure sputtering method. Specifically, the first ferromagnetic layer (CoFe) was formed in an argon atmosphere at a low pressure of 0.05 Pa. Since this layer forming method was an ordinary one, it was anticipated that a crystal structure of the first ferromagnetic layer (CoFe) was mainly a bcc structure.

An MR ratio of Sample Nos. 1 to 17 of the MR element that were fabricated through the method discussed above was measured. Then, a crystal structure of the first ferromagnetic layer (CoFe), which was an interface with the spacer layer (GaN), was estimated through observing a transmission electron microscope (TEM) picture in a vertical cross section. A detailed method is discussed below.

When crystallization with at least a three-atom layer was confirmed within a crystal structure of a CoFe structure part of the first ferromagnetic layer that contacted the spacer layer (GaN), a crystal structure, such as a bcc structure, an fcc structure, or an hcp structure, was determined. When it was difficult to determine a crystal structure, the crystal structure was determined as an amorphous layer. Each existing ratio of these crystal structures was expressed by an area ratio (%) at the interface. The area ratio (%) is an index showing the percentage of the area occupied by each crystal structure.

Results are shown in Table 1-2 below.

TABLE 1-2

| Sample No. | Crystal (Lattice) Structure of CoFe (%) | | | | | MR Ratio (%) |
|---|---|---|---|---|---|---|
|  | amorphous | bcc | fcc | hcp | fcc + hcp |  |
| 1 | 0 | 100 | 0 | 0 | 0 | 16 |
| 2 | 0 | 80 | 20 | 0 | 20 | 18 |
| 3 | 10 | 90 | 0 | 0 | 0 | 17 |
| 4 | 10 | 90 | 0 | 0 | 0 | 15 |
| 5 | 20 | 70 | 0 | 10 | 10 | 15 |
| 6 | 0 | 100 | 0 | 0 | 0 | 17 |
| 7 | 0 | 80 | 10 | 10 | 20 | 19 |
| 8 | 20 | 80 | 0 | 0 | 0 | 17 |
| 9 | 10 | 80 | 10 | 0 | 10 | 18 |
| 10 | 10 | 70 | 10 | 10 | 20 | 20 |
| 11 | 0 | 80 | 10 | 10 | 20 | 19 |
| 12 | 20 | 60 | 10 | 10 | 20 | 22 |
| 13 | 0 | 90 | 10 | 0 | 10 | 16 |
| 14 | 10 | 60 | 20 | 10 | 30 | 41 |
| 15 | 20 | 80 | 0 | 0 | 0 | 18 |
| 16 | 0 | 100 | 0 | 0 | 0 | 14 |
| 17 | 10 | 90 | 0 | 0 | 0 | 18 |
| Average | 8 | 82 | 6 | 4 | 9 | 19 |

Regarding Table 1-2 above, the following provides reasons for the focus on the sum of a percentage of the fcc structure and a percentage of the hcp structure.

FIGS. 7A-7D and 8 show the correlations between a percentage of several types of structures (amorphous, bcc, fcc, and hcp) and an MR ratio based on data in Table 1-2 above.

Figure 7A:
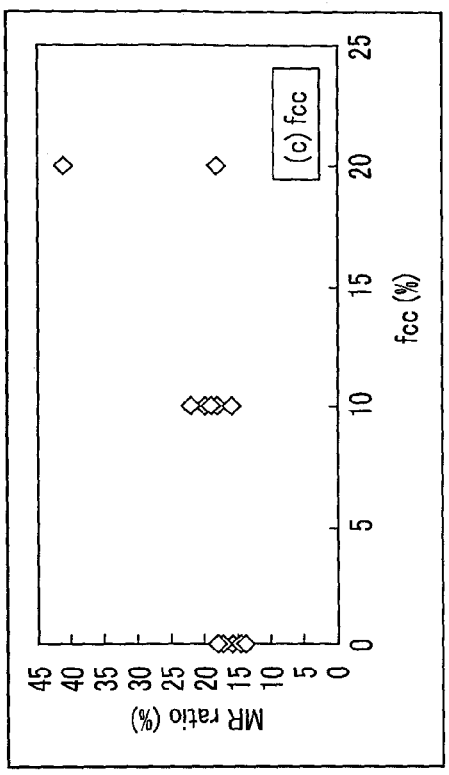
FIG. 7A is a graph for showing a correlation between a percentage (%) of an amorphous state and an MR ratio.
Figure 7C:
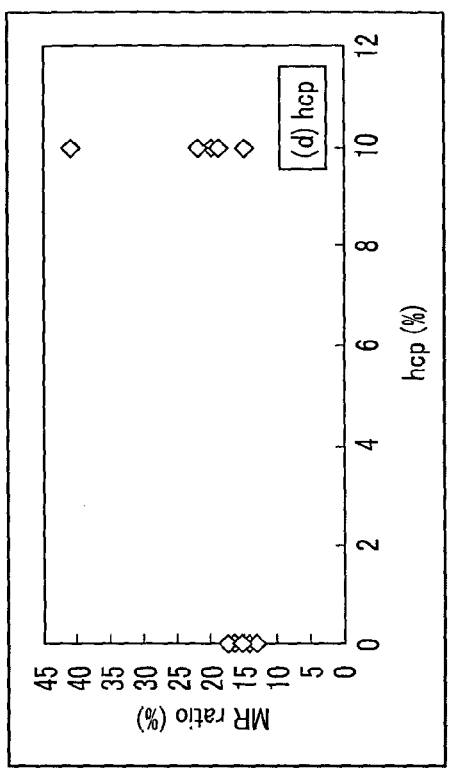
FIG. 7C is a graph for showing a correlation between a percentage (%) of an fcc structure and an MR ratio.
Figure 7B:
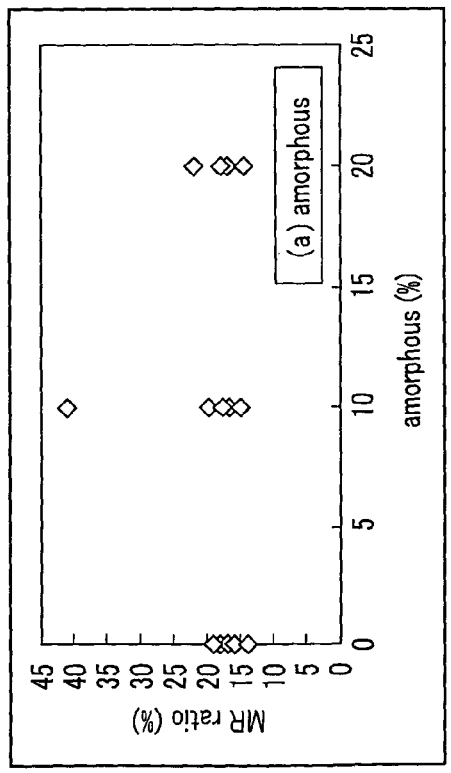
FIG. 7B is a graph for showing a correlation between a percentage (%) of a bcc structure and an MR ratio.
Figure 7D:
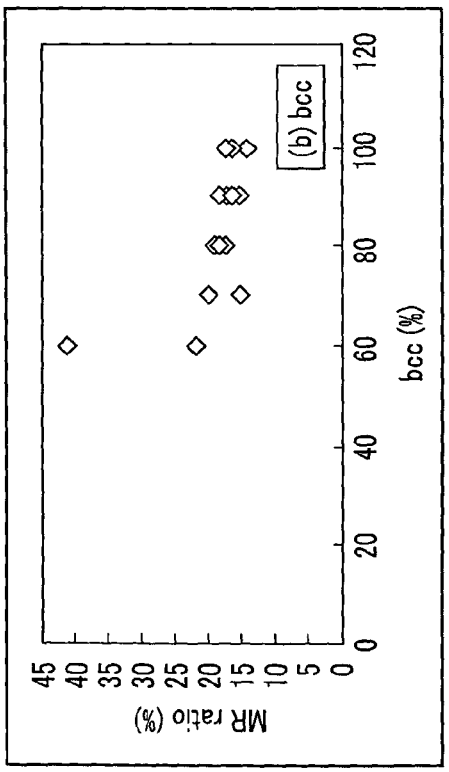
FIG. 7D is a graph for showing a correlation between a percentage (%) of an hcp structure and an MR ratio.
Figure 8:
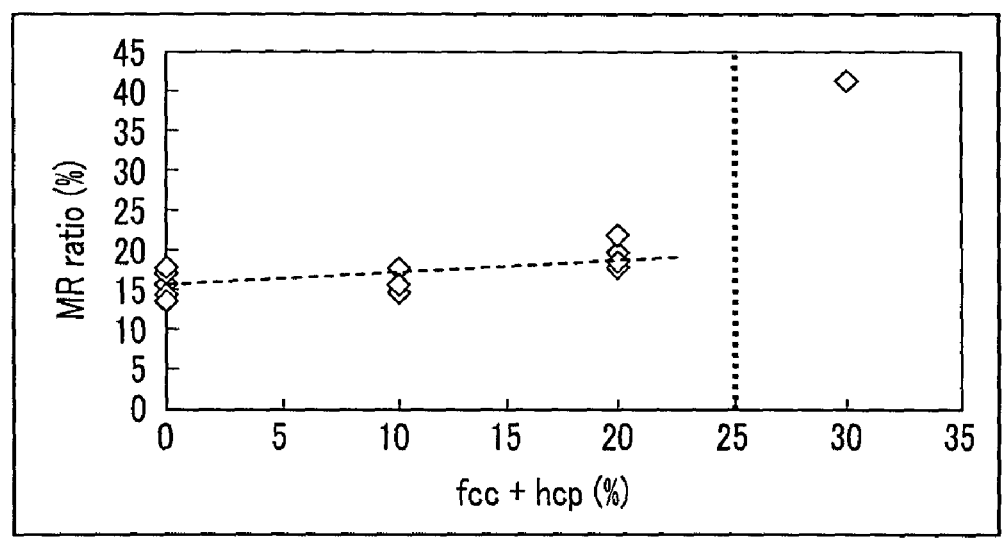
FIG. 8 is a graph for showing a correlation between the sum of percentages of an fcc structure and an hcp structure that are close packed structures and an MR ratio.

FIG. 7A is a graph for showing a correlation between a percentage (%) of the amorphous state and the MR ratio. FIG. 7B is a graph for showing a correlation between a percentage (%) of the bcc structure and the MR ratio. FIG. 7C is a graph for showing a correlation between a percentage (%) of the fcc structure and the MR ratio. FIG. 7D is a graph for showing a correlation between a percentage (%) of the hcp structure and the MR ratio. Then, FIG. 8 is a graph for showing a correlation between the sum of the percentage of the fcc structure as a close packed structure and the percentage of the hcp structure as a close packed structure, and the MR ratio.

Based on the results shown in FIGS. 7A-7D, a correlation to some extent between the percentage of the fcc structure and the MR ratio and between the percentage of the bcc structure and the MR ratio might exist. However, because the deviation was large, it was not clear whether such a correlation actually exists. In contrast, a correlation with a small deviation is observed in FIG. 8, with respect to the sum of the percentages of the fcc and hcp structures as a close packed structure and the MR ratio. There is only one spot (datum) showing a high MR ratio in FIG. 8 (see an MR ratio of approximately 40% at 30% of fcc+hcp % with the remaining data appearing below an MR ratio of 25%). However, it is understood that there is a threshold value between 20 to 30% of the percentage of the close packed structures around which a value of the MR ratio is rapidly increased.

Experiment 2

2. First Ferromagnetic Layer (CoFe) (CoFe System Magnetic Alloy), Formed by a High Pressure Sputtering Method Experiment 2 was performed under the condition that the sputtering method was changed, i.e., the low pressure sputtering method of above Experiment 1 for forming the first ferromagnetic layer (CoFe), which is a CoFe system magnetic alloy, was changed to a high pressure sputtering method. The high pressure sputtering method was a layer forming process in an argon atmosphere at a pressure of 0.3 Pa. This pressure was six times higher compared with Experiment 1. Sample Nos. 18 to 39 of a CPP-MR element with respect to Experiment 2 were fabricated in the same manner as in Experiment 1 except for the sputtering pressure.

In Experiment 2, a crystalline state of CoFe was intentionally degraded. Namely, an ordinary layer forming condition tended to form CoFe in a bcc structure with a (110) orientation; however, because the first ferromagnetic layer (CoFe) was formed in a high pressure argon atmosphere, the crystalline state was degraded. In other words, since the crystalline state was degraded under the high pressure atmosphere, it was understood that its crystalline state was temporarily a pseudo-amorphous state. It was also understood that this degraded crystalline state was crystallized again by a heat treatment process (250° C., three hours) that was performed after a lamination layer was formed.

Note that the second ferromagnetic layer that was made of CoFe was not changed from Experiment 1 and was formed by the low pressure sputtering process.

An MR ratio of Sample Nos. 18 to 39 of the MR element that were fabricated through the method discussed above was measured. Then, a crystal structure of the first ferromagnetic layer (CoFe), which was an interface with the spacer layer (GaN), was estimated through observing a TEM picture in a vertical cross section.

Each existing ratio of these crystal structures was expressed by an area ratio (%) at the interface with the same method as in Experiment 1.

Results are shown in Table 2 below.

TABLE 2

| Sample No. | Crystal (Lattice) Structure of CoFe (%) | | | | | MR Ratio (%) |
| --- | --- | --- | --- | --- | --- | --- |
| | amorphous | bcc | Fcc | hcp | fcc + hcp | |
| 18 | 10 | 70 | 20 | 0 | 20 | 26 |
| 19 | 40 | 40 | 20 | 0 | 20 | 28 |
| 20 | 10 | 40 | 30 | 20 | 50 | 49 |
| 21 | 50 | 30 | 20 | 0 | 20 | 30 |
| 22 | 10 | 40 | 40 | 10 | 50 | 49 |
| 23 | 20 | 70 | 10 | 0 | 10 | 22 |
| 24 | 10 | 60 | 10 | 20 | 30 | 45 |
| 25 | 40 | 20 | 40 | 0 | 40 | 47 |
| 26 | 10 | 60 | 30 | 0 | 30 | 42 |
| 27 | 30 | 30 | 20 | 20 | 40 | 46 |
| 28 | 20 | 60 | 10 | 10 | 20 | 29 |
| 29 | 10 | 60 | 0 | 30 | 30 | 41 |
| 30 | 0 | 90 | 10 | 0 | 10 | 18 |
| 31 | 20 | 50 | 20 | 10 | 30 | 45 |
| 32 | 20 | 50 | 30 | 0 | 30 | 43 |
| 33 | 0 | 80 | 20 | 0 | 20 | 23 |
| 34 | 10 | 90 | 0 | 0 | 0 | 18 |
| 35 | 30 | 20 | 40 | 10 | 50 | 47 |
| 36 | 40 | 40 | 10 | 10 | 20 | 23 |
| 37 | 10 | 70 | 10 | 10 | 20 | 24 |
| 38 | 20 | 40 | 30 | 10 | 40 | 47 |
| 39 | 30 | 50 | 0 | 20 | 20 | 22 |
| Average | 20 | 53 | 19 | 8 | 27 | 35 |

FIGS. 9A-9D and 10 show correlations between a percentage of several types of structures (amorphous, bcc, fcc, and hcp) and an MR ratio based on data in Table 2 above.

Figure 9A:
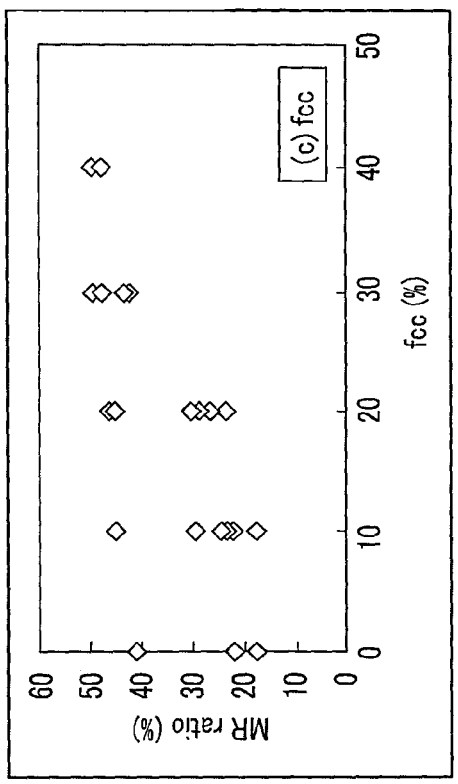
FIG. 9A is a graph for showing a correlation between a percentage (%) of an amorphous state and an MR ratio.
Figure 9C:
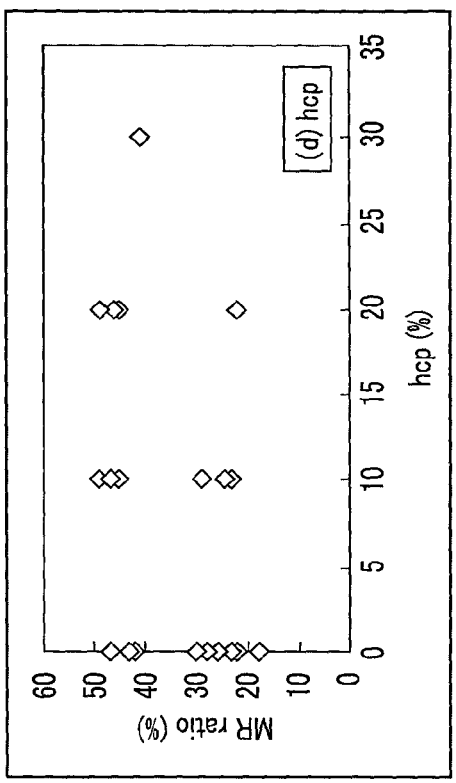
FIG. 9C is a graph for showing a correlation between a percentage (%) of an fcc structure and an MR ratio.
Figure 9B:
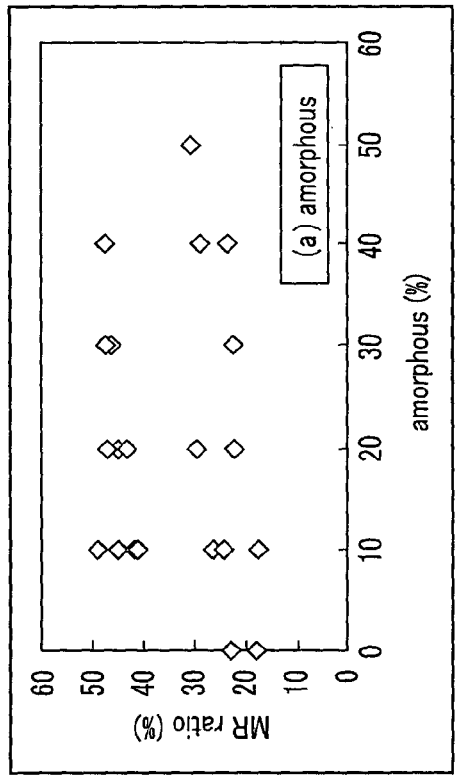
FIG. 9B is a graph for showing a correlation between a percentage (%) of a bcc structure and an MR ratio.
Figure 9D:
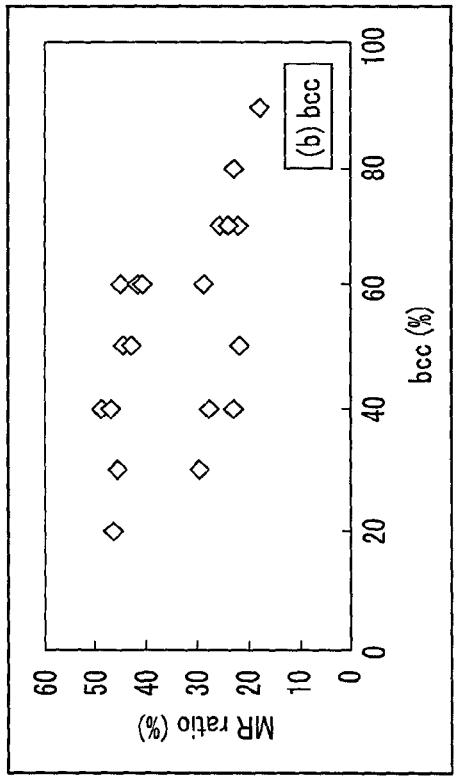
FIG. 9D is a graph for showing a correlation between a percentage (%) of an hcp structure and an MR ratio.
Figure 10:
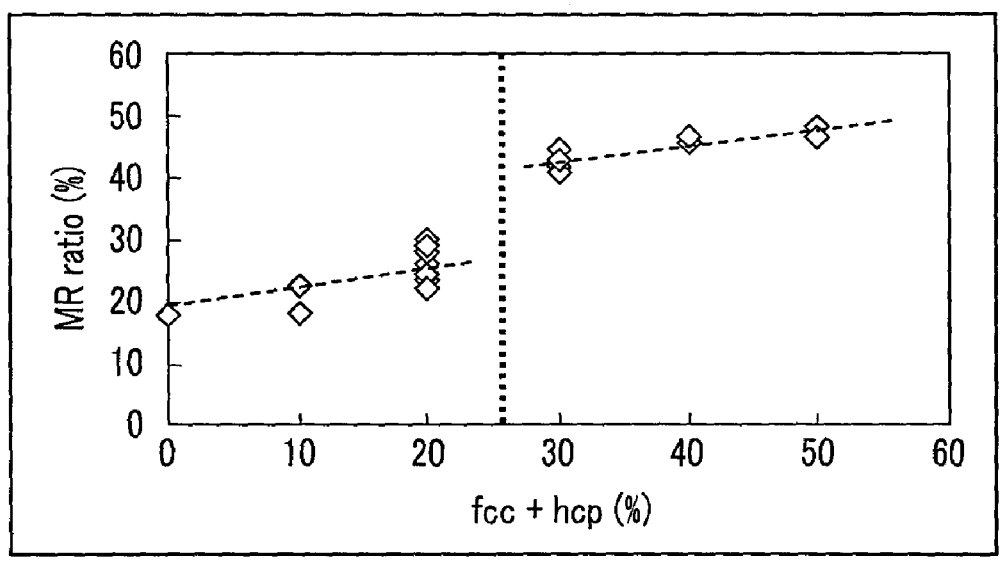
FIG. 10 is a graph for showing a correlation between the sum of percentages of an fcc structure and an hcp structure that are close packed structures and an MR ratio.

FIG. 9A is a graph for showing a correlation between a percentage (%) of the amorphous state and the MR ratio. FIG. 9B is a graph for showing a correlation between a percentage (%) of the bcc structure and the MR ratio. FIG. 9C is a graph for showing a correlation between a percentage (%) of the fcc structure and the MR ratio. FIG. 9D is a graph for showing a correlation between a percentage (%) of the hcp structure and the MR ratio. FIG. 10 is a graph for showing a correlation between the sum of a percentage of the fcc structure as a close packed structure and a percentage of the hcp structure as a close packed structure, and the MR ratio.

It was understood that there was not a clear correlation between each percentage of the structures and the MR ratio according to data shown in FIGS. 9A-9D.

In contrast, it was observed that there was a correlation with a small deviation between the sum of the percentages of the fcc and hcp structures as a close packed structure and the MR ratio as shown in FIG. 10. Seeing that the sum of the percentages of the fcc and hcp structures was 25% or more, specifically, 30% or more, and more specifically, 50% or more, the MR ratio exhibits very high values as shown in FIG. 10. According to the results, it is understood that the existence of CoFe with the fcc structure and the hcp structure that are close packed structures largely contributes to the higher MR ratio.

Experiment 3

3. First Ferromagnetic Layer (CoFe System Magnetic Alloy), Formed with Boron (B) Added to CoFe The first ferromagnetic layer (CoFe), which is a CoFe system magnetic alloy, in Experiment 1 was changed to $B_{10}(Co_{30}Fe_{70})_{90}$ in which boron (B) was added to CoFe. Except for this change, Sample Nos. 40 to 53 of a CPP-MR element with respect to Experiment 3 were fabricated in the same manner as in Experiment 1 as shown in Table 3 below. A condition of a layer forming process for $B_{10}(Co_{30}Fe_{70})_{90}$ was in an argon atmosphere at a pressure of 0.3 Pa.

In Experiment 3, amorphous (noncrystalline) CoFe was formed by adding boron (B) in order to form CoFe that has a degraded crystalline state at a layer forming process of the first ferromagnetic layer.

It was understood that this amorphous (noncrystalline) CoFe was crystallized again by a heat treatment process (250° C., three hours) that was performed after the layer forming process.

An MR ratio of Sample Nos. 40 to 53 of the MR element that were fabricated through the process discussed above was measured. Then, a crystal structure of the first ferromagnetic layer (CoFe), which was an interface with the spacer layer (GaN), was estimated through observing a TEM picture in a vertical cross section.

Each existing ratio of these crystal structures was expressed by an area ratio (%) at the interface with the same method as performed in Experiment 1.

Results are shown in Table 3 below.

TABLE 3

| Sample No. | Crystal (Lattice) Structure of CoFe (%) | | | | | MR Ratio (%) |
| --- | --- | --- | --- | --- | --- | --- |
| | amorphous | bcc | fcc | hcp | fcc + hcp | |
| 40 | 20 | 20 | 20 | 40 | 60 | 53 |
| 41 | 50 | 0 | 20 | 30 | 50 | 46 |
| 42 | 10 | 20 | 30 | 40 | 70 | 55 |

TABLE 3-continued

| | Crystal (Lattice) Structure of CoFe (%) | | | | | MR Ratio |
|---|---|---|---|---|---|---|
| Sample No. | amorphous | bcc | fcc | hcp | fcc + hcp | (%) |
| 43 | 20 | 10 | 20 | 50 | 70 | 56 |
| 44 | 20 | 20 | 40 | 20 | 60 | 44 |
| 45 | 10 | 20 | 10 | 60 | 70 | 49 |
| 46 | 40 | 30 | 10 | 20 | 30 | 40 |
| 47 | 0 | 30 | 40 | 30 | 70 | 58 |
| 48 | 10 | 30 | 30 | 30 | 60 | 51 |
| 49 | 40 | 0 | 20 | 40 | 60 | 45 |
| 50 | 50 | 0 | 10 | 40 | 50 | 41 |
| 51 | 80 | 10 | 10 | 0 | 10 | 21 |
| 52 | 40 | 0 | 10 | 50 | 60 | 50 |
| 53 | 10 | 20 | 20 | 50 | 70 | 50 |
| Average | 29 | 15 | 21 | 36 | 56 | 47 |

FIGS. 11A-11D and 12 show correlations between a percentage of several types of structures (amorphous, bcc, fcc, and hcp) and an MR ratio based on data in Table 3 above.

Figure 12:
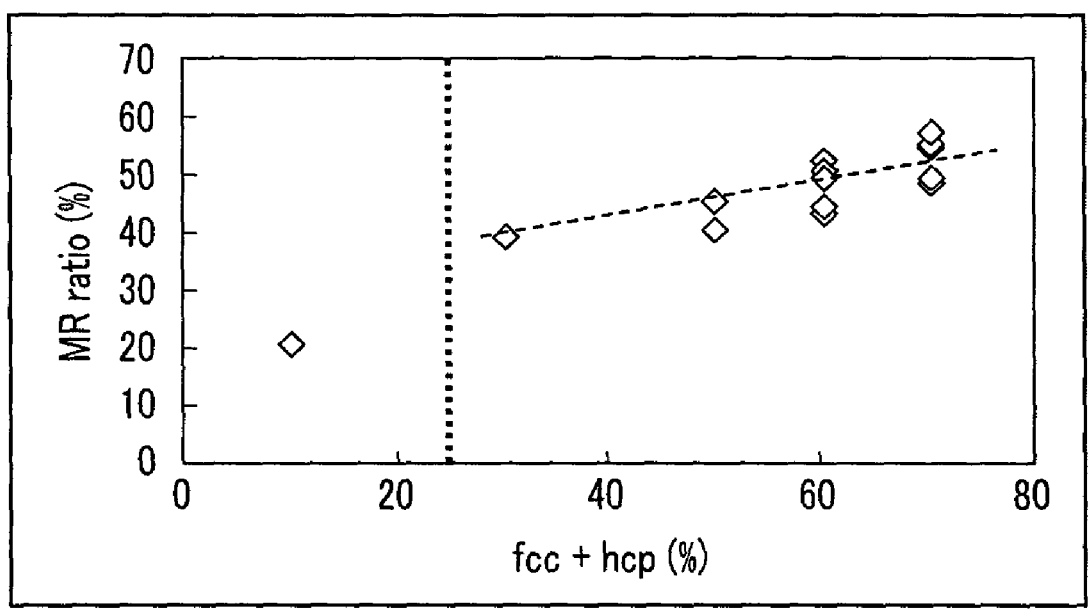
FIG. 12 is a graph for showing a correlation between the sum of percentages of an fcc structure and an hcp structure that are close packed structures and an MR ratio.
Figure 14:
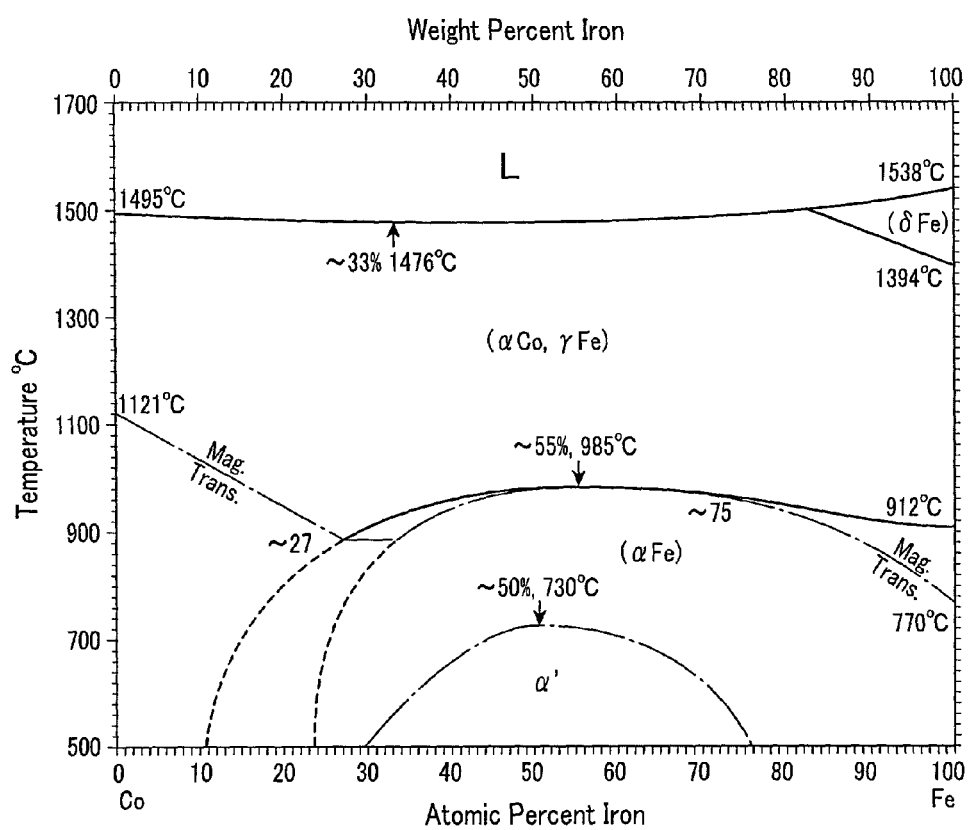
FIG. 14 is a phase diagram of Co—Fe.

FIG. 11A is a graph for showing a correlation between a percentage (%) of the amorphous state and the MR ratio. FIG. 11B is a graph for showing a correlation between a percentage (%) of the bcc structure and the MR ratio. FIG. 11C is a graph for showing a correlation between a percentage (%) of the fcc structure and the MR ratio. FIG. 11D is a graph for showing a correlation between a percentage (%) of the hcp structure and the MR ratio. FIG. 12 is a graph for showing a correlation between the sum of the percentages of the fcc and hcp structures as a close packed structure, and the MR ratio.

Based on the results shown in FIGS. 11A-11D, a correlation may exist to some extent between the amorphous state and the MR ratio and between the fcc structure and the MR ratio. However, it is unclear as to whether such a correlation in fact exists. In contrast, it was observed that there was a correlation with a small deviation between the sum of the percentages of the fcc and hcp structures as a close packed structure and the MR ratio as shown in FIG. 12. Seeing that the sum of the percentages of the fcc and hcp structures is 25% or more, specifically 30% or more, and more specifically, 50% or more, the MR ratio shows very high values as shown in FIG. 12. According to the results, it is understood that the existence of CoFe with the fcc structure and the hcp structure that are close packed structures largely contributes to an appearance of the higher MR ratio. It is understood from FIGS. 11 and 12 that the method for degrading the crystalline state of an initial state by adding boron (B) is effective because an existing ratio of the element in which the sum of the fcc structure and the hcp structure is 25% or more is significantly increased.

Experiment 4

4. First Ferromagnetic Layer and the Second Ferromagnetic Layer (CoFe System Magnetic Alloy), Each Formed with Boron (B) Added to CoFe The second ferromagnetic layer (CoFe), is a CoFe system magnetic alloy, in Experiment 3 was changed to $B_{10}(Co_{30}Fe_{70})_{90}$ in which boron (B) was added to CoFe. The first and second ferromagnetic layers, which were CoFe magnetic alloys that sandwich the spacer layer, were made of $B_{10}(Co_{30}Fe_{70})_{90}$. Except for this change, samples of a CPP-MR element with respect to Experiment 4 were fabricated in the same manners as in Experiment 3 discussed above.

A condition of a layer forming process for $B_{10}(Co_{30}Fe_{70})_{90}$ was in an argon atmosphere at a pressure of 0.3 Pa.

In Experiment 4, amorphous (noncrystalline) CoFe was formed by adding boron (B) in order to form CoFe that has a degraded crystalline state at layer forming processes of the first and second ferromagnetic layers. It was understood that this amorphous (noncrystalline) CoFe was crystallized again by a heat treatment process (250° C., three hours) that was performed after the layer forming process.

An MR ratio of samples of the MR element that were fabricated through the process discussed above was measured. Then, crystal structures of the first and second ferromagnetic layer (CoFe), which were an interface with the spacer layer (GaN), were estimated through observing a TEM picture in a vertical cross section.

Each existing ratio of these crystal structures was expressed by an area ratio (%) at the interface with the same method as performed in Experiment 1.

As a result, it was confirmed that samples of Experiment 4 obtained higher MR ratios (56 to 64%; average was 61%) compared with Experiment 3.

It is understood that these results reflect the effect of the structure that the CoFe magnetic layer contacting the spacer layer is a close packed structure regardless of the positional relationship, such as upper or lower, between the CoFe magnetic layer and the spacer layer.

According to the experimental results above, an effect of the present invention is apparent.

In an MR element according to the present invention, an effect of an extremely-high MR ratio is obtained because crystal structures of a CoFe magnetic layer in the vicinity of the interface with the spacer layer are formed as a phase of a close packed structure, such as an hcp structure and an fcc structure, and the total existing ratio of these crystal structures is 25% or more by an area ratio.

Possibilities for the industrial use of the present invention include its use in a magnetic disk device with an MR element that detects magnetic field intensity as a signal from a magnetic recording medium, and so on.

What is claimed is:

1. A magnetoresistive effect element (MR element) that is a giant magnetoresistive effect element in a current perpendicular to plane (CPP-GMR) structure, comprising:
    a spacer layer;
    a first ferromagnetic layer and a second ferromagnetic layer that are laminated to sandwich the spacer layer, in which a sense current flows along a lamination direction of the first and second ferromagnetic layers, wherein
    the first ferromagnetic layer is formed before the second ferromagnetic layer is formed, and is located below the second ferromagnetic layer,
    angle of magnetization directions of the first ferromagnetic layer and the second ferromagnetic layer relatively change due to an externally applied magnetic field,
    the spacer layer is configured with a nonmagnetic material of a hexagonal system,
    at least one of the first ferromagnetic layer and the second ferromagnetic layer is configured with a CoFe system magnetic alloy (CoFe and an alloy of CoFe as a main component) containing a component of Fe with at least 25% by atomic weight,
    the CoFe system magnetic alloy has a face centered cubic (fcc) structure and/or a hexagonal closed package (hcp) structure as a crystal structure at an interface with the spacer layer, and
    a total existing ratio of the fcc structure and the hcp structure in the CoFe system magnetic alloy at the interface with the spacer layer is 25% or more by an area ratio.

2. The MR element according to claim 1, wherein
    both the first ferromagnetic layer and the second ferromagnetic layer are configured with the CoFe system magnetic alloy, which is made of CoFe or has CoFe as the main component, containing the component of Fe with at least 25% by atomic weight, and the CoFe system magnetic alloys have the fcc structure and/or the hcp structure as the crystal structure at the interface with the spacer layer, and the total existing ratio of the fcc structure and the hcp structure in the CoFe system magnetic alloy of the first ferromagnetic layer at the interface with the spacer layer is 25% or more by the area ratio, and the total existing ratio of the fcc structure and the hcp structure in the CoFe system magnetic alloy of the second ferromagnetic layer at the interface with the spacer layer is 25% or more by the area ratio.

3. The MR element according to claim 1 or 2, wherein a crystal orientation of the fcc structure in the CoFe system magnetic alloy is a (111) plane, and a crystal orientation of the hcp structure in the CoFe system magnetic alloy is a (002) plane.

4. The MR element according to claim 1 or 2, wherein the first ferromagnetic layer and the second ferromagnetic layer have a characteristic to be crystallized by a heat treatment.

5. The MR element according to claim 1 or 2, wherein the spacer layer is made of one nitride selected from the following: GaN, AlN, InN, TaN, and NbN.

6. A thin film magnetic head comprising:

an air bearing surface (ABS) that is opposite to a recording medium;

the magnetoresistive effect element (MR element) according to claim 1 that is provided in the vicinity of the ABS to detect a signal magnetic field from the recording medium; and a pair of electrodes that apply an electric current in a lamination direction of the MR element.

7. A head gimbal assembly comprising:

a slider having the thin film magnetic head according to claim 6 and being provided opposite to the recording medium; and a suspension elastically supporting the slider.

8. A magnetic disk device comprising:

a slider having the thin film magnetic head according to claim 6 and being provided opposite to the recording medium; and a positioning device supporting the slider and locating a position of the slider with respect to the recording medium.

* * * * *